(12) United States Patent
Idani

(10) Patent No.: US 8,153,525 B2
(45) Date of Patent: Apr. 10, 2012

(54) POLISHING METHOD, POLISHING APPARATUS, AND METHOD FOR MANUFACTURING SEMICONDUCTOR DEVICE

(75) Inventor: Naoki Idani, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1019 days.

(21) Appl. No.: 12/055,753

(22) Filed: Mar. 26, 2008

(65) Prior Publication Data
US 2008/0242081 A1    Oct. 2, 2008

(30) Foreign Application Priority Data

Mar. 28, 2007 (JP) .................. 2007-085038

(51) Int. Cl.
*H01L 21/302* (2006.01)

(52) U.S. Cl. ............... 438/691; 438/692; 216/88

(58) Field of Classification Search ......... 438/691, 438/692, 693, 690; 451/5, 6, 134, 8; 216/88, 216/89
See application file for complete search history.

(56) References Cited

U.S. PATENT DOCUMENTS

| 6,387,807 B1 * | 5/2002 | Faubert et al. | 438/687 |
| 7,074,109 B1 * | 7/2006 | Bennett et al. | 451/5 |

FOREIGN PATENT DOCUMENTS

JP          2003-175455 A    6/2003

* cited by examiner

*Primary Examiner* — Lan Vinh

(74) *Attorney, Agent, or Firm* — Westerman, Hattori, Daniels & Adrian, LLP

(57) ABSTRACT

A polishing method includes a first polishing step of halfway polishing a film to be polished formed on a substrate, and a second polishing step of further polishing the polished film, wherein a first film thickness profile showing an in-plane distribution of a film thickness of the polished film after the second polishing step for a first substrate is measured, and the first polishing step for a second substrate is executed to obtain a second film thickness profile which has a size relation in a film thickness opposite to the first film thickness profile.

2 Claims, 16 Drawing Sheets

POLISHING METHOD, POLISHING APPARATUS, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2007-85038, filed on Mar. 28, 2007, the entire content of which is incorporated herein by reference.

TECHNICAL FIELD

The present invention relates to a polishing method and a polishing apparatus which polishes a film to be polished, and a method for manufacturing a semiconductor device using the polishing method.

BACKGROUND OF THE INVENTION

As one method for improving in-plane uniformity of CMP (Chemical Mechanical Polishing), Japanese Patent Application Laid-Open No. 2003-175455 discloses a method for detecting an eddy current generated on a surface of a wiring material at the time of CMP, monitoring distribution of a residual film thickness of the wiring material and feedback-controlling a head pressure so that CMP is carried out flatly.

In order to heighten polishing throughput, the wiring material should be polished in two steps. In this case, after the wiring material is polished at a first polishing step so that its residual film thickness becomes about 200 nm and the surface is flattened, the remaining wiring material is polished at a second polishing step.

However, when the wiring material is polished at the second polishing step, the residual film thickness of the wiring material is extremely small or becomes zero as the polishing progresses. For this reason, distribution of the film thickness cannot be monitored by an eddy current. That is, the distribution of the film thickness of the wiring material can be controlled practically only at the first polishing step.

In the case where different polishing pads are used at the first polishing step and the second polishing step like the case of using a multi-platen polishing device, polishing rate profiles are different between these polishing steps. For this reason, even if the residual film thickness of the wiring material is controlled flatly at the first polishing step, the polishing distribution is deflected at the second polishing step, and occasionally the film thickness of a formed wiring layer varies in a wafer plane.

The similar problem arises not only in the case of CMP of the wiring material but also in the case of CMP of an insulating material to be used in a step of forming an element separation film by means of an STI method, for example.

SUMMARY

According to an aspect of an embodiment, a polishing method includes a first polishing step of halfway polishing a film to be polished formed on a substrate, and a second polishing step of further polishing the polished film, wherein a first film thickness profile showing an in-plane distribution of a film thickness of the polished film after the second polishing step for a first substrate is measured, and the first polishing step for a second substrate is executed to obtain a second film thickness profile which has a size relation in a film thickness opposite to the first film thickness profile.

According to another aspect of an embodiment, a polishing apparatus polishing a film to be polished formed on a substrate at a first polishing step and a second polishing step, the apparatus includes: a polishing platen; a polishing head arranged so as to be opposed to the polishing platen and including a plurality of pressure zones; a film thickness monitor measuring a distribution of a film thickness of the polished film at the time of polishing the polished film; a control mechanism feedback-controlling a pressure to be applied to the plurality of pressure zones of the polishing head based on the measured result of the film thickness monitor at the time of polishing the polished film; a memory device storing therein a database in which a plurality of polishing conditions on the polishing platen are related with a film thickness profile group obtained by the conditions; and a polishing condition determining mechanism storing a first film thickness profile after the second polishing step for a first substrate, and selecting a specific film thickness profile having a size relation in a film thickness opposite to the first film thickness profile from the film thickness profile group in the first polishing step for a second substrate.

According to another aspect of an embodiment, a method of manufacturing a semiconductor device, includes: a first step of forming an insulating film on a semiconductor substrate; a second step of forming a wiring groove on the insulating film; a third step of forming a barrier metal layer on the insulating film formed with the wiring groove; a fourth step of forming a metal film on the barrier metal layer; a fifth step of halfway removing the metal film formed on an area which is not formed with the wiring groove by means of polishing; a sixth step of removing the metal film by means of polishing until the barrier metal layer on the area which is not formed with the wiring groove is exposed; and a seventh step of removing the barrier metal layer by means of polishing until the insulating film on the area which is not formed with the wiring groove is exposed, wherein a first film thickness profile showing an in-plane distribution of a film thickness of the metal film after the sixth step is measured in advance, and in the fifth step, the polishing is carried out by using a polishing condition for obtaining a second film thickness profile having a size relation in a film thickness opposite to the first film thickness profile.

According to another aspect of an embodiment, a method of manufacturing a semiconductor device, includes: a first step of forming an element isolation groove on a semiconductor substrate using a mask formed on the semiconductor substrate; a second step of forming an insulating film on the semiconductor substrate formed with the element isolation groove; a third step of halfway removing the insulating film on an area which is not formed with the element isolation groove by means of polishing; a fourth step of removing the insulating film by means of polishing until the surface of the insulating film is flattened; and a fifth step of removing the insulating film by means of polishing until the mask is exposed, wherein a first film thickness profile showing an in-plane distribution of a film thickness of the insulating film after the fourth step is measured in advance, and in the third step, the polishing is carried out by using a polishing condition for obtaining a second film thickness profile having a size relation in a film thickness opposite to the first film thickness profile.

DETAILED DESCRIPTION OF THE EMBODIMENT

[First Embodiment]

A polishing device and a polishing method according to a first embodiment will be described with reference to FIGS. 1 to 9.

Figure 1:
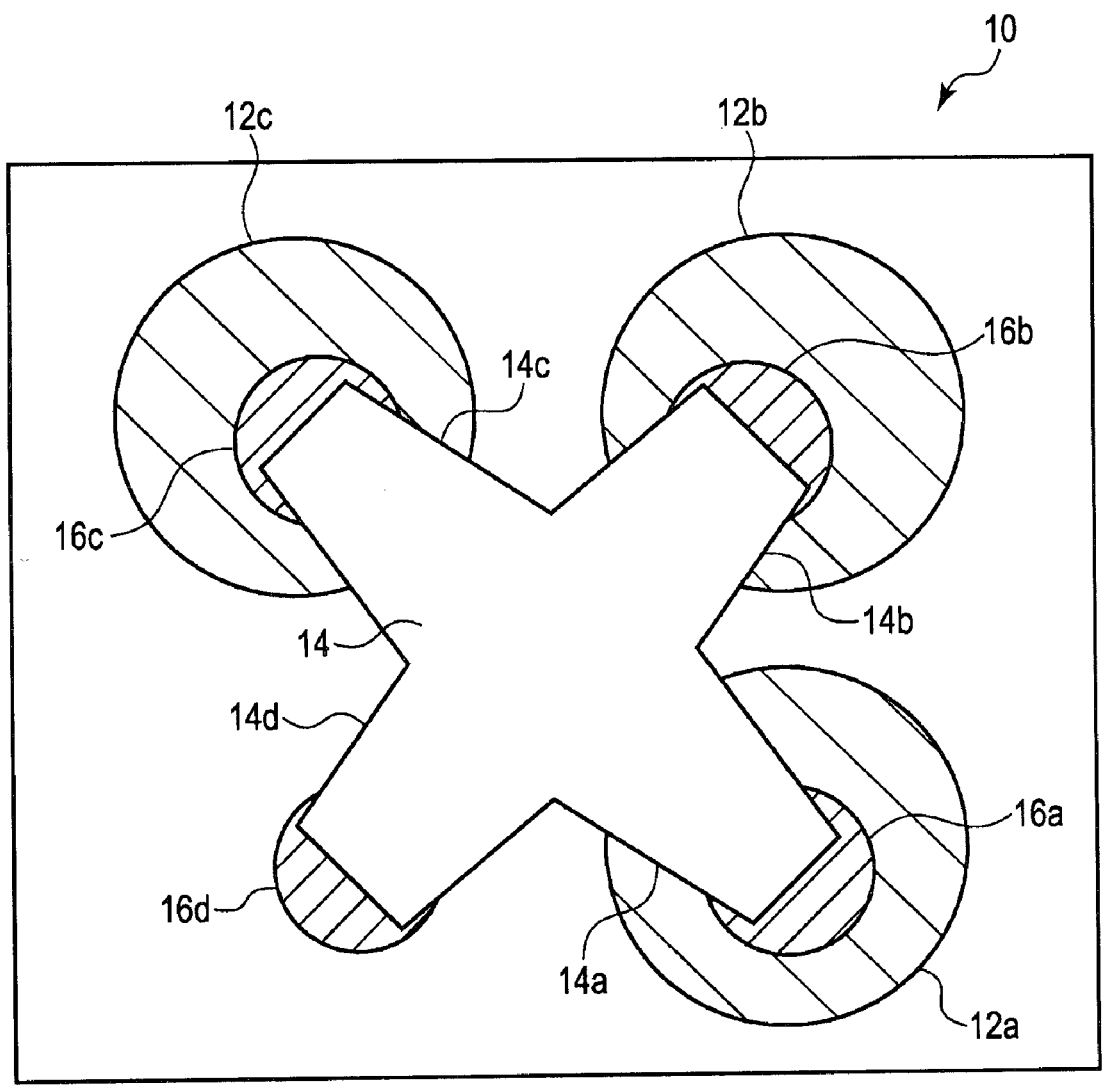
FIG. 1 is a schematic plan view illustrating an entire constitution of a polishing device according to a first embodiment of the present invention.
Figure 2:
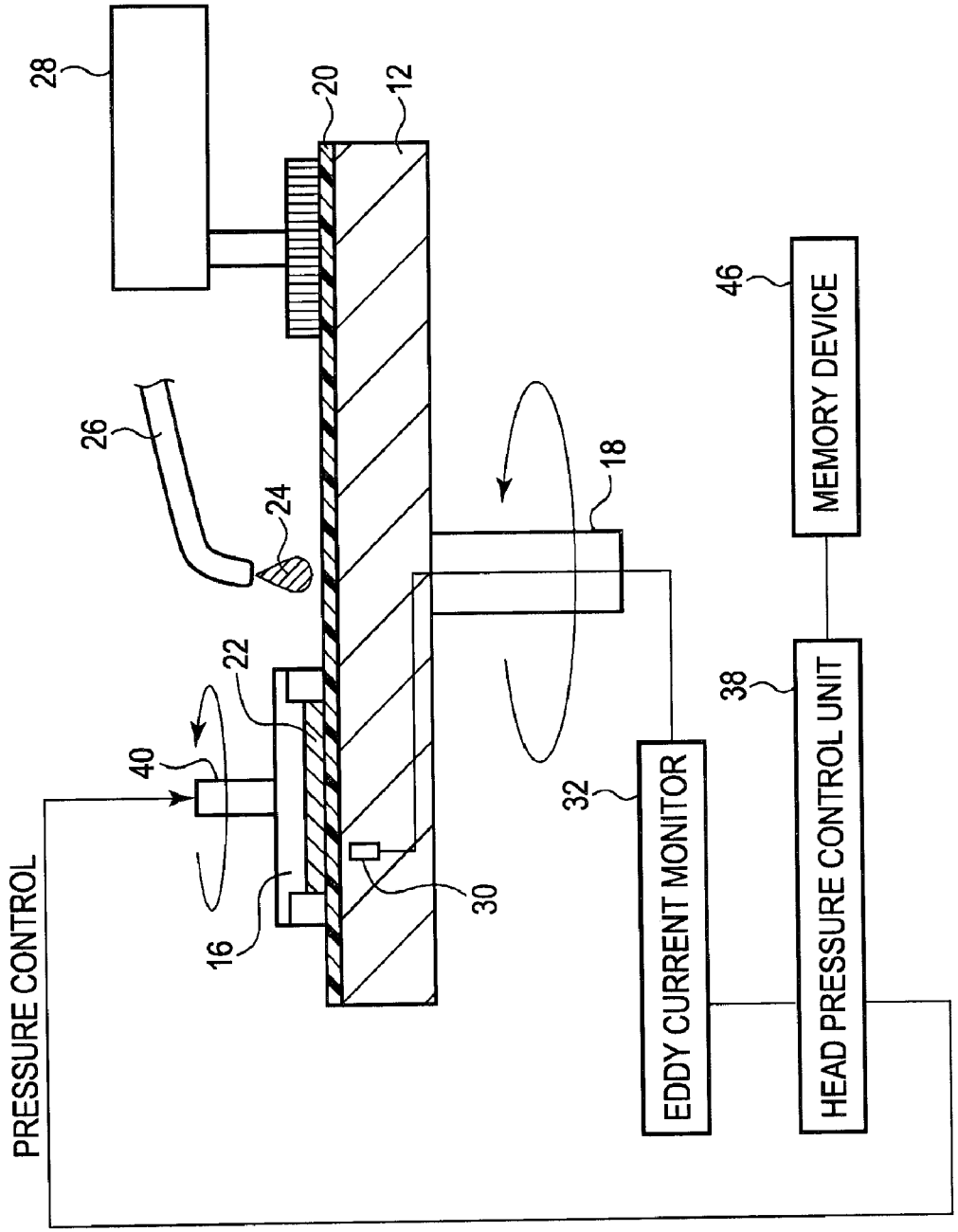
FIG. 2 is a schematic sectional view illustrating a concrete constitution of the polishing device according to the first embodiment of the present invention.
Figure 3A:
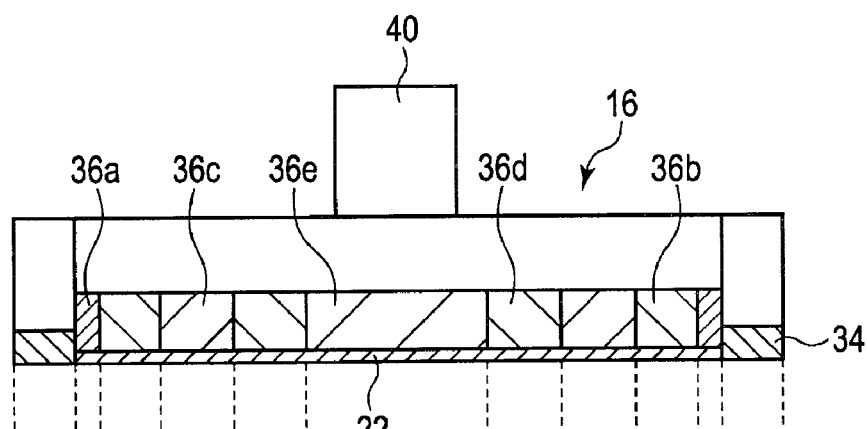
FIG. 3A is a schematic cross-sectional view illustrating a constitution of a polishing head of the polishing device according to the first embodiment of the present invention.
Figure 3B:
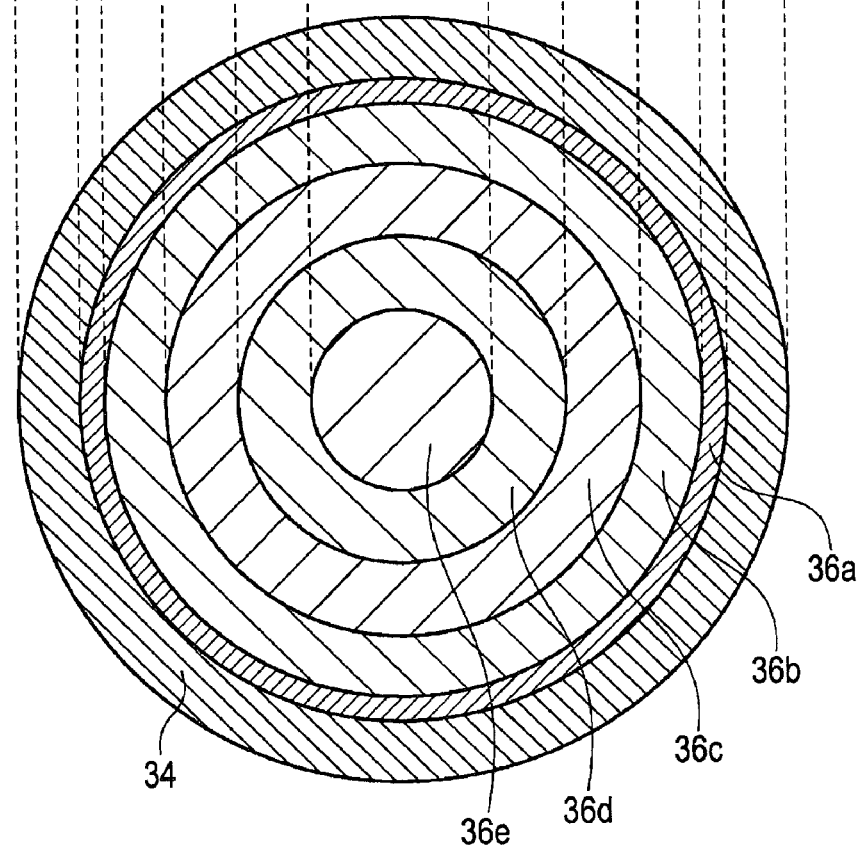
FIG. 3B is a schematic vertical-sectional view illustrating the constitution of the polishing head of the polishing device according to the first embodiment of the present invention.
Figure 4A:
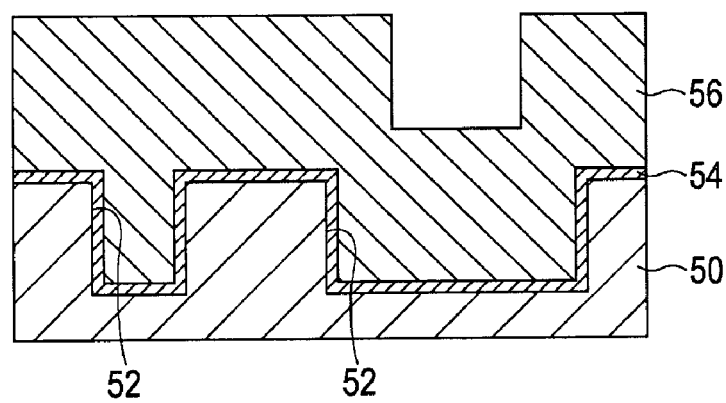
FIGS. 4A to 4D are schematic step diagrams illustrating a polishing method according to the first embodiment of the present invention.
Figure 5:
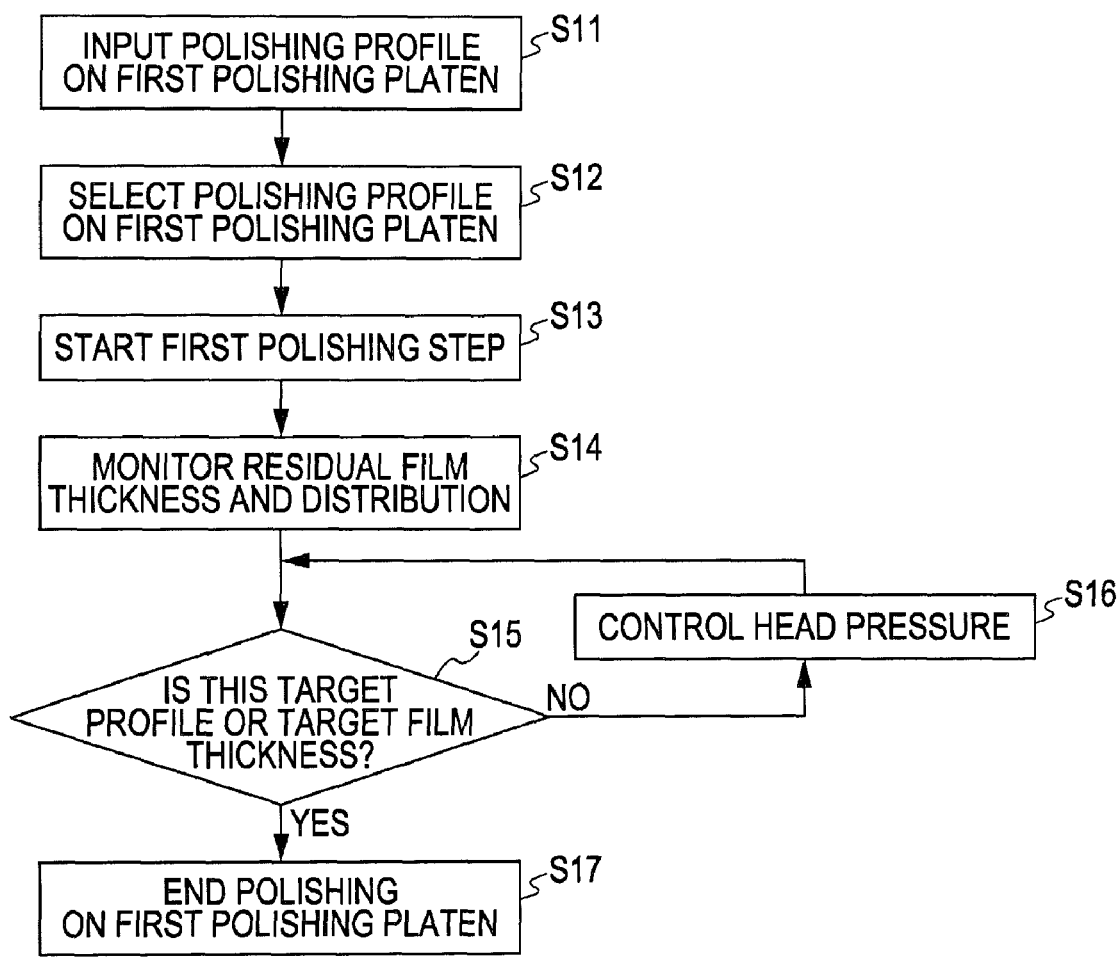
FIG. 5 is a flow chart explaining a first polishing step of the polishing method according to the first embodiment of the present invention.
Figure 6A:
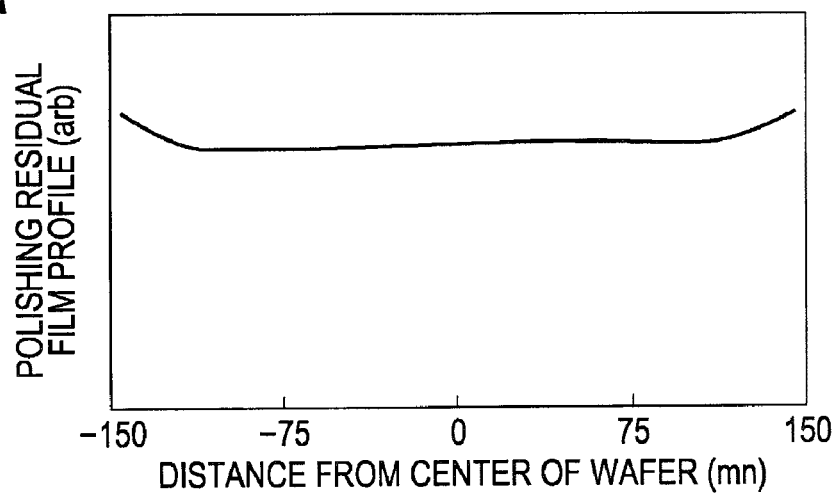
FIGS. 6A to 6C are graphs illustrating examples of polishing residual film profiles at the first polishing step of the polishing method according to the first embodiment of the present invention.
Figure 6B:
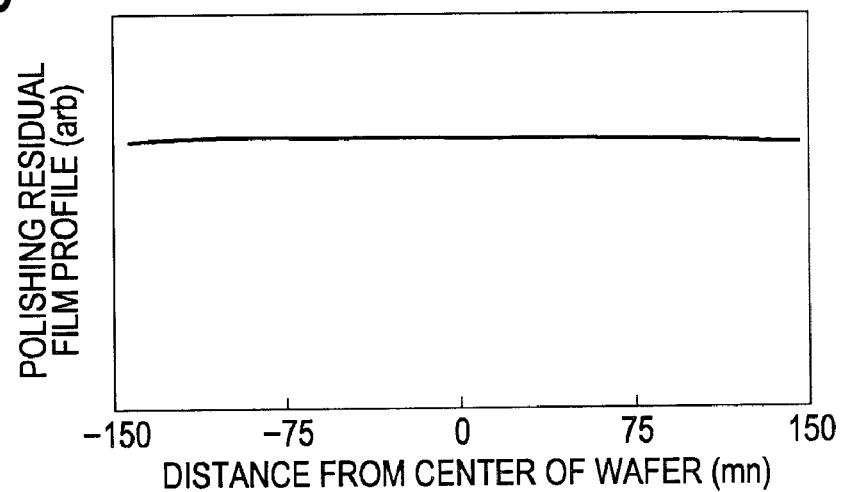
Figure 6C:
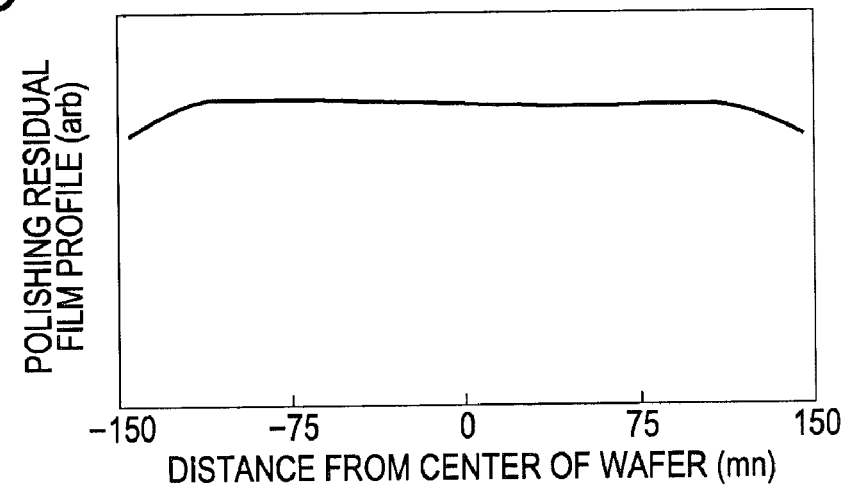
Figure 7:
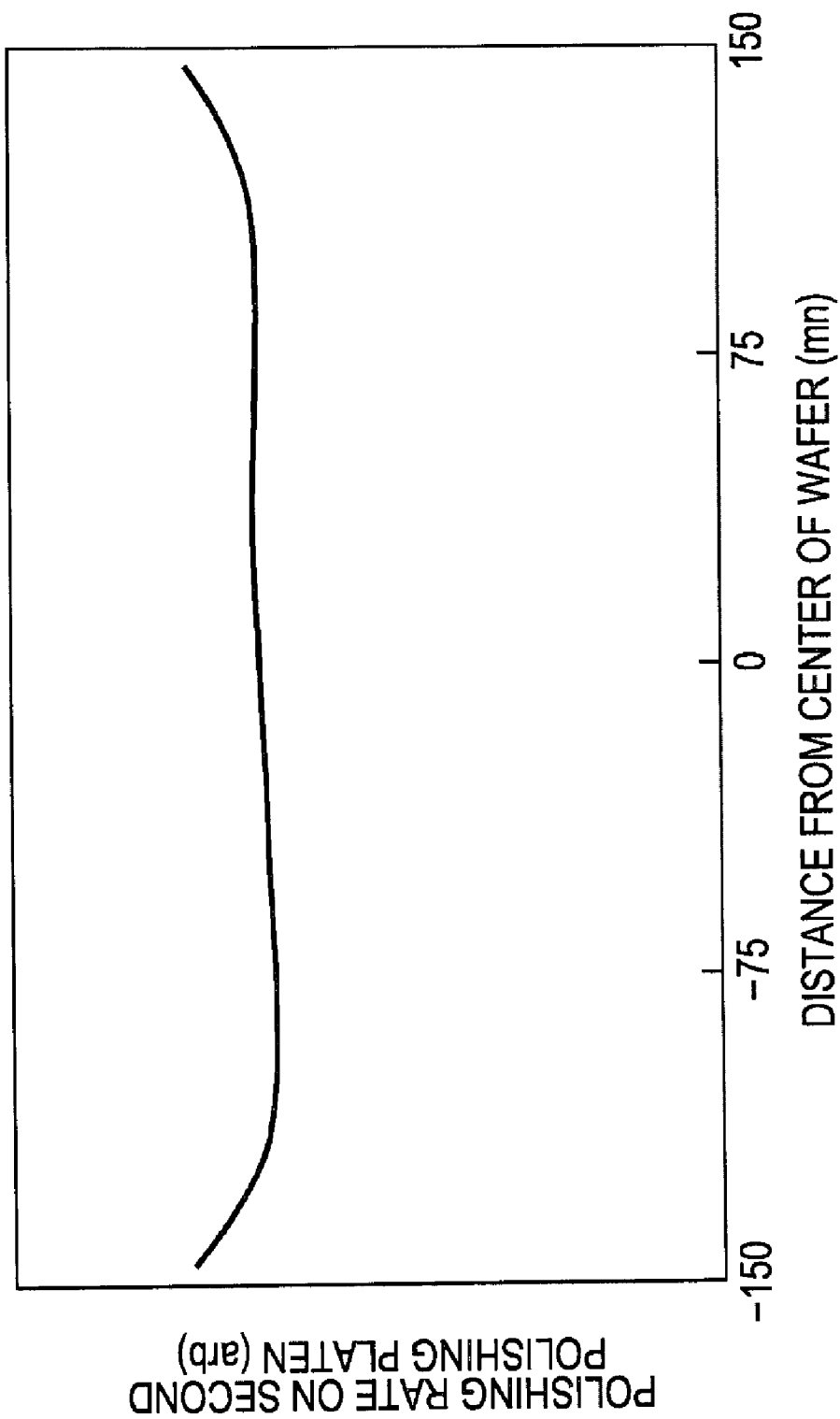
FIG. 7 is a graph illustrating an example of a polishing rate profile at a second polishing step of the polishing method according to the first embodiment of the present invention.
Figure 8:
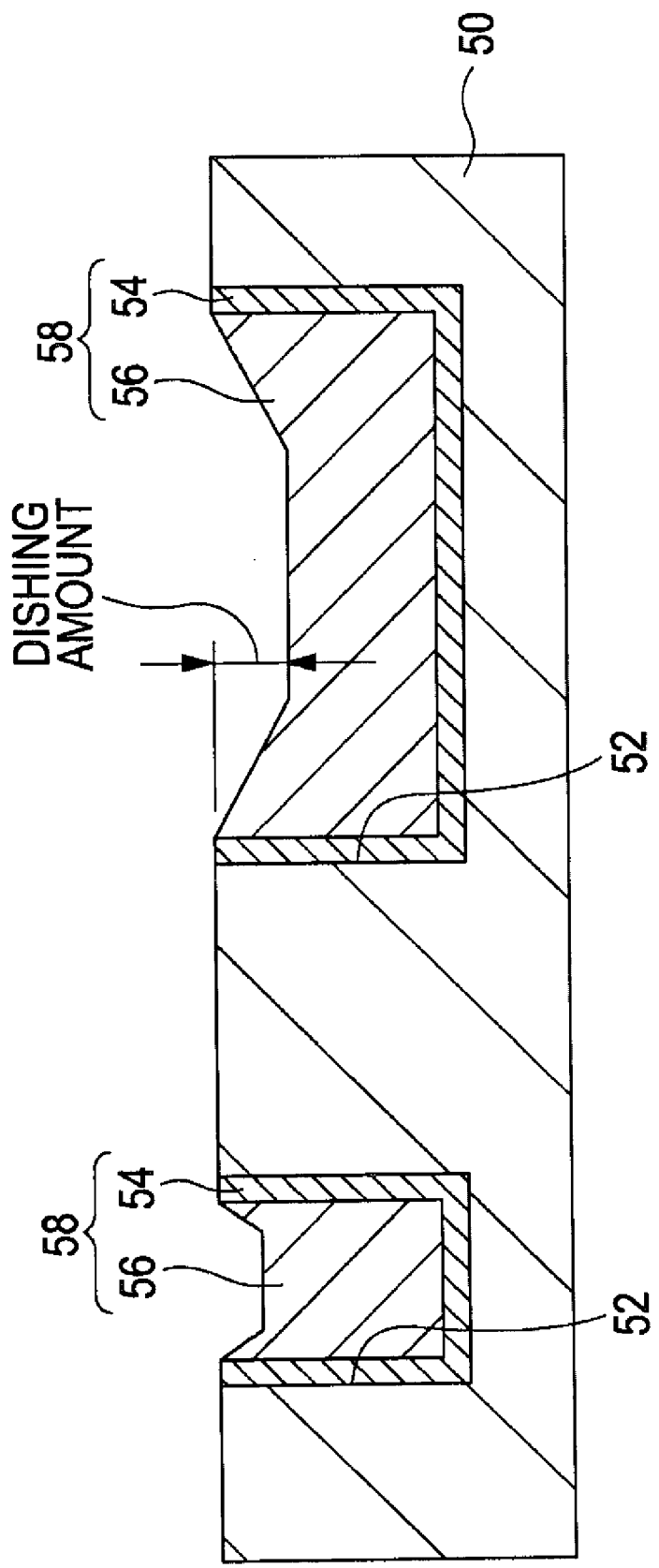
FIG. 8 is a diagram explaining a dishing amount of a wiring layer.
Figure 9:
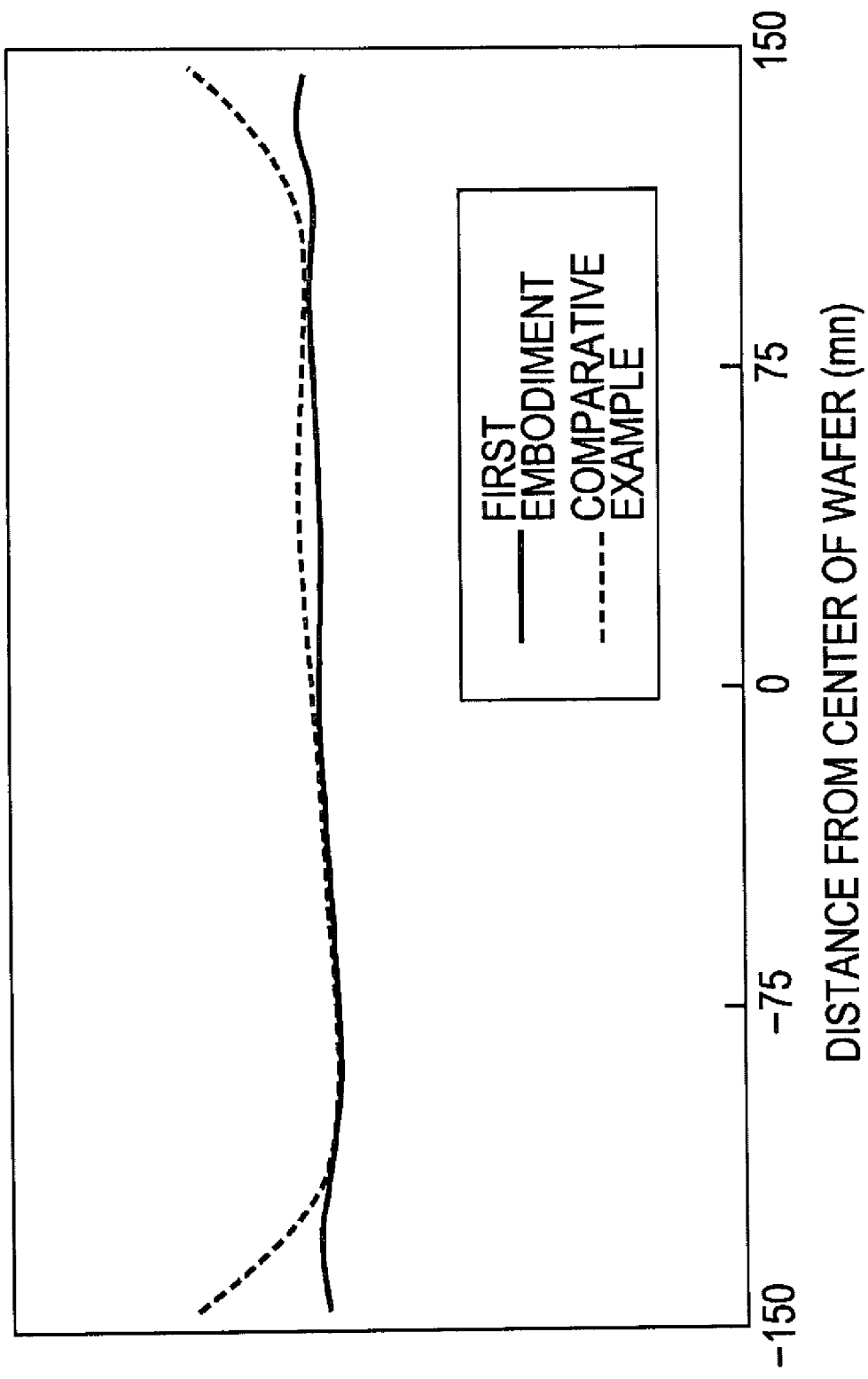
FIG. 9 is a graph illustrating a wafer in-plane distribution of the dishing amount of the wiring layer formed by the polishing method according to the first embodiment of the present invention.

FIG. 1 is a schematic plan view illustrating an entire constitution of the polishing device according to the first embodiment, and FIG. 2 is a schematic sectional view illustrating a concrete constitution of the polishing device according to the first embodiment. FIG. 3A is a cross-sectional view illustrating a constitution of a polishing head according to the first embodiment, and FIG. 3B is a vertical-sectional view illustrating the constitution of the polishing head according to the first embodiment. FIGS. 4A to 4D are step diagrams illustrating the polishing method according to the first embodiment, and FIG. 5 is a flow chart explaining a first polishing step of the polishing method according to the first embodiment. FIGS. 6A to 6C are graphs illustrating examples of polishing residual film profiles at the first polishing step, and FIG. 7 is a graph illustrating an example of a polishing rate profile at a second polishing step. FIG. 8 is a diagram explaining a dishing amount of a wiring layer, and FIG. 9 is a graph illustrating a wafer in-plane distribution of the dishing amount of the wiring layer.

The polishing device according to the first embodiment will be described with reference to FIGS. 1 to 3.

As shown in FIG. 1, a polishing device 10 according to the first embodiment has three polishing platens 12a, 12b and 12c. An arm support 14 having four arms 14a, 14b, 14c and 14d is provided onto the polishing platens 12a, 12b and 12c. Polishing heads 16a, 16b, 16c and 16d are provided at front edges of the arms 14a, 14b, 14c and 14d, respectively. When the arm support 14 is rotated about its center, the polishing heads 16a, 16b, 16c and 16d can be successively moved onto the polishing platens 12a, 12b and 12c.

As shown in FIG. 2, a polishing pad 20 is stuck onto each polishing platen 12. A semiconductor wafer 22 to be polished is held to the polishing head so that its polished surface is opposed to the polishing pad 20. A slurry supply nozzle 26 which drops slurry 24 onto the polishing pad 20 is provided above the polishing platen 12. A toothing device 28 which files the polishing pad 20 between polish or during polish is provided above the polishing platen 12. The polishing platen 12 can rotate about a shaft 18.

An eddy current detector 30 which measures an eddy current generated on a surface of the on-polishing semiconductor wafer 22 is embedded into the polishing platen 12 below the polishing head 16. The eddy current detector 30 is connected to an eddy current monitor 32. Therefore, a polishing residual film and a distribution can be monitored based on signals detected by the eddy current detector 30.

As shown in FIG. 3, the polishing head 16 has a retainer ring 34 which supports the semiconductor wafer 22, and a plurality of pressure chambers 36a, 36b, 36c, 36d and 36e which are separated concentrically. The pressure chambers 36a, 36b, 36c, 36d and 36e control a pressure at the time of pressing the semiconductor wafer 22 against the polishing pad 20. From a viewpoint of fine control of polishing distribution, it is desirable that five or more pressure chambers 36 be provided. The polishing head 16 can rotate about a shaft 40.

As shown in FIG. 2, the polishing head 16 is connected to a head pressure control unit 38. As a result, the pressure at the time of pressing against the polishing pad 20 can be controlled for respective zones of the semiconductor wafer 22 corresponding to the pressure chambers 36a, 36b, 36c, 36d and 36e. The head pressure control unit 38 is connected to the eddy current monitor 32. As a result, a polishing pressure of the semiconductor wafer 22 can be controlled based on signals detected by the eddy current detector 30.

The head pressure control unit 38 is connected to a memory device 46. A database, which shows a relationship between a plurality of polishing conditions and a plurality of polishing profiles obtained by polishing using these conditions, is stored in the memory device 46. As a result, the polishing condition for obtaining any polishing profile can be extracted quickly by referring to the database in the memory device 46. The polishing profiles include a polishing residual film profile showing in-plane distribution of a residual film thickness after the polish, and a polishing rate profile showing in-plane distribution of a polishing rate.

The polishing method according to the first embodiment will be described below with reference to FIGS. 1 to 9. The description refers to an example in which the polishing method according to the first embodiment is applied to a case where a copper wiring is formed by a damascene method at a back end process of a semiconductor device.

The semiconductor wafer 22 to be polished is prepared. As shown in FIG. 4A, for example, the semiconductor wafer 22 has an inter-layer insulating film 50 with a film thickness of 350 nm which is formed with a wiring groove 52 with a depth of 200 nm, a barrier metal layer 54 with a film thickness of 8 nm which is formed on an entire surface of the inter-layer insulating film 50 including the wiring groove 52, and a copper film 56 with a film thickness of 700 nm which is formed on the barrier metal layer 54. The semiconductor wafer 22 is obtained by forming the inter-layer insulating film 50 on a ground substrate, forming the wiring groove 52 on the inter-layer insulating film 50, and sequentially depositing the barrier metal layer 54 and the copper film 56 on the inter-layer insulating film 50 formed with the wiring groove 52.

The semiconductor wafer 22 is polished by using the polishing device shown in FIG. 1. A CMP process for forming a copper wiring is generally divided into two polishing steps of polishing the copper film 56 and of polishing the barrier metal layer 54. The polishing step for the copper film 56 whose polishing time is long is divided into two steps, so that the polishing may be carried out in three steps.

When the polishing is carried out in three steps, the polishing platens 12a, 12b and 12c of the polishing device shown in FIG. 1 are allocated to the respective steps, so that the plurality of semiconductor wafers 22 can be processed successionally. The first polishing step of eliminating a level difference of the copper film 56 is executed on the polishing platen 12a, and the second polishing step of eliminating an unnecessary portion of the copper film 56 is executed on the polishing platen 12b. The third polishing step of eliminating an unnecessary portion of the barrier metal layer 54 is executed on the polishing platen 12c.

The semiconductor wafer 22 to be polished is carried into the polishing device 10. In the polishing device 10 of FIG. 1, the semiconductor wafer 22 is carried on to the polishing platen 12a used at the first polishing step by the polishing head 16a.

Figure 4B:
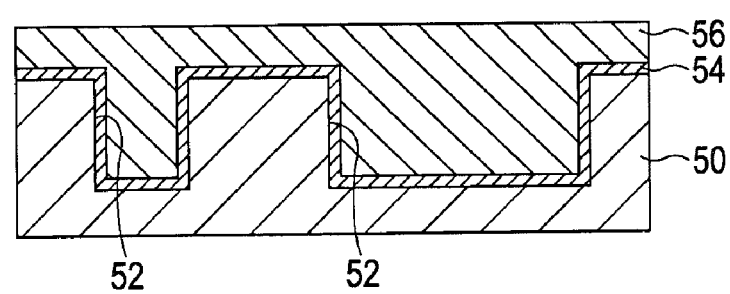

At the first polishing step, as shown in FIG. 4B, the copper film 56 is polished until the film thickness (residual film thickness) of the copper film 56 on the inter-layer insulating film 50 becomes about 200 nm, so that the level difference on the surface of the copper film 56 caused by the wiring groove 52 is eliminated. The residual film thickness of the copper film 56 is not necessarily 200 nm as long as it falls within a range where the eddy current detector 30 can detect the film thickness.

At the first polishing step, "IC1000" manufactured by NITTA HAAS INCORPORATED, for example, is used as the polishing pad, and "HS-C800-1" manufactured by Hitachi Chemical Co., Ltd. is used as slurry. The polishing is carried out under a condition that the pressure of the polishing head is 210 gf/cm$^2$, the rotating speed of the polishing head is 60 rpm, the rotating speed of the polishing platens is 70 rpm, and a supply quantity of the slurry is 0.3 lit/min. When a harder polishing pad such as "IC1000" is used as the polishing pad, the level difference of the copper film 56 can be efficiently reduced. The polishing pressure described here is an average pressure to be applied to the semiconductor wafer 22, and in the case of the polishing head having a plurality of zones, the pressure should be set according to the zones.

A concrete flow chart of the first polishing step will be described with reference to FIG. 5.

Prior to the polishing process, a database, which shows a relationship between the polishing conditions and polishing profiles obtained by the polishing using the conditions in the case of using the polishing platen 12a, is input into the memory device 46 (step S11). Examples of the polishing residual film profile include a profile where a wafer edge becomes thick as shown in FIG. 6A, a profile which is flat as shown in FIG. 6B, and a profile where the wafer edge becomes thin as shown in FIG. 6C.

The polishing residual film profile shown in FIG. 6A can be realized by, for example, setting the pressure of the retainer ring to 505 kgf/cm$^2$, a pressure of a zone 1 to 260 kgf/cm$^2$, a pressure of a zone 2 to 180 kgf/cm$^2$, a pressure of a zone 3 to 220 kgf/cm$^2$, a pressure of a zone 4 to 240 kgf/cm$^2$, and a pressure of a zone 5 to 240 kgf/cm$^2$. The areas on the semiconductor wafer 22 corresponding to the pressure chambers 36a, 36b, 36c, 36d and 36e are the zone 1, the zone 2, the zone 3, the zone 4 and the zone 5, respectively.

The polishing residual film profile shown in FIG. 6B can be realized by, for example, setting the pressure of the retainer ring to 520 kgf/cm$^2$, the pressure of the zone 1 to 315 kgf/cm$^2$, the pressure of the zone 2 to 180 kgf/cm$^2$, the pressure of the zone 3 to 220 kgf/cm$^2$, the pressure of the zone 4 to 240 kgf/cm$^2$, and the pressure of the zone 5 to 240 kgf/cm$^2$.

The polishing residual film profile shown in FIG. 6C can be realized by, for example, setting the pressure of the retainer ring to 540 kgf/cm$^2$, the pressure of the zone 1 to 330 kgf/cm$^2$, the pressure of the zone 2 to 180 kgf/cm$^2$, the pressure of the zone 3 to 220 kgf/cm$^2$, the pressure of the zone 4 to 240 kgf/cm$^2$, and the pressure of the zone 5 to 240 kgf/cm$^2$.

The polishing residual film profile can be set arbitrarily according to necessity besides the profiles shown in FIGS. 6A to 6C.

When the operation for inputting the database at step S11 is once performed, this operation is not always necessary because data are accumulated in the memory device 46. When new data about the relationship between the polishing conditions and the polishing residual film profiles is necessary, that data may be input suitably. Numerical values may be input, or the data may be input by handwriting using a pen-type input device. At this time, a control width (a film thickness range of the polishing residual film) of the profile may be input as values.

A desired polishing residual film profile to be obtained at the first polishing step is selected from the database input at step S11 (step S12). The polishing residual film profile may be selected automatically from the database in the memory device 46 by a computer, or may be selected by an operator. The reason why the polishing residual film profile is selected at the first polishing step will be described later.

The polishing of the semiconductor wafer 22 is started by using the polishing condition related with the selected polishing residual film profile (step S13). When a suitable polishing residual film profile is not present in the database, a new polishing condition may be calculated by parity of reasoning based on an existing database. For example, when the suitable polishing residual film profile is positioned between the two polishing residual film profiles on the database, a condition between the polishing conditions for obtaining the two polishing residual film profiles on the database may be calculated. Alternatively, a new polishing condition may be input. During the polishing of the semiconductor wafer 22, the eddy current detector 30 detects an eddy current generated on the surface of the copper film 56, and the eddy current monitor 32 monitors a residual film thickness of the copper film 56 and its distribution (step S14).

When the monitored residual film thickness of the copper film 56 is not a target film thickness, the polishing process is continued. When the monitored profile is not a target one, the head pressure is controlled so that a target polishing residual film profile can be obtained (step S16), and the polishing process is continued. The head pressure is controlled by controlling pressures of the pressure chambers 36a to 36e in the polishing head 16.

For example, as to the selected polishing residual film profile, when the residual film thickness on a peripheral portion of the semiconductor wafer 22 is comparatively thicker than a residual film thickness of a center portion, the pressures of the pressure chambers 36a to 36e are controlled so that the set values of the pressures of the pressure chambers corresponding to the zones on the peripheral portion of the semiconductor wafer 22 are comparatively increased. As to the selected polishing residual film profile, when the residual film thickness on the peripheral portion of the semiconductor wafer 22 is comparatively thinner than the residual film thickness of the center portion, the pressures of the pressure chambers 36a to 36e are controlled so that the set values of the pressures of the pressure chambers corresponding to the zones on the peripheral portion of the semiconductor wafer 22 are comparatively reduced.

When the monitored residual film thickness of the copper film 56 reaches a target film thickness (for example, 200 nm), the first polishing step on the polishing platen 12a is ended (step S17).

When the first polishing step is ended, the arm support 14 is rotated, and the semiconductor wafer 22 supported by the polishing head 16a is carried onto the polishing platen 12b. The second polishing step is then executed on the polishing platen 12b.

Figure 4C:
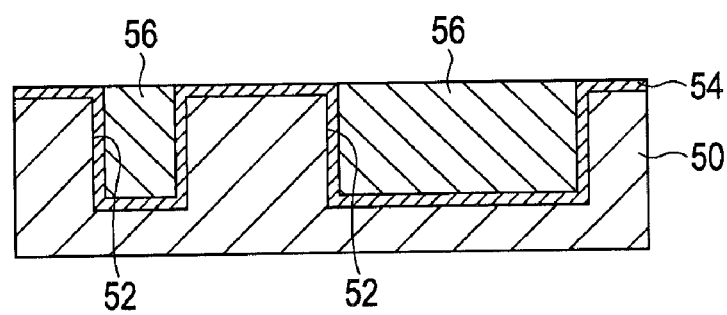

At the second polishing step, as shown in FIG. 4C, the copper film 56 is polished until the barrier metal layer 54 on an area which is not formed with the wiring groove 52 is exposed, and the copper film 56 on portions other than the inside of the wiring groove 52 is eliminated.

At the second polishing step, "IC1400" manufactured by NITTA HAAS INCORPORATED is used as the polishing pad, and "HS-C800-1" manufactured by Hitachi Chemical Co., Ltd. is used as the slurry. The polishing is carried out under the condition that the pressure of the polishing head is 210 gf/cm$^2$, the rotating speed of the polishing head is 60 rpm, the rotating speed of the polishing platen is 70 rpm, and the supply quantity of the slurry is 0.3 lit/min. The polishing pressure described here is an average pressure to be applied to the semiconductor wafer 22, and in the case of the polishing head having a plurality of zones, the pressure should be set according to the zones.

At the second polishing step, since the residual film thickness of the copper film 56 is extremely small or becomes zero as the polishing progresses, the eddy current detector 30 cannot monitor the distribution of the film thickness. For this reason, it is desirable that the polishing profile of the second polishing step be measured in advance.

FIG. 7 illustrates one example of the polishing rate profile at the second polishing step. In this polishing rate profile, the polishing rate on the outer periphery of the wafer tends to be high (edge fast). Since the polishing profile of the second polishing step depends on polishing members to be used and conditions, it is not limited to the profile of FIG. 7.

When the polishing rate profile at the second polishing step is obtained in advance, a polishing profile which negates the polishing rate profile at the second polishing step is selected as the polishing profile at the first polishing step. As a result, the residual film distribution at the time when the second polishing step is ended can be set uniformly in a plane. For example, when the polishing rate profile at the second polishing step tends to be the edge fast as shown in FIG. 7, the polishing residual film profile shown in FIG. 6A, where the wafer edge becomes slightly thicker than that in the flat polishing residual film profile shown in FIG. 6B, is applied to the first polishing step. As a result, after the second polishing step, flatter polishing properties can be obtained.

The database, which shows the relationship between the polishing conditions and the polishing profiles obtained by the polishing using the conditions at the first polishing step, is accumulated in the memory device 46, and a suitable polishing residual film profile is selected from the database, so that the first polishing step is executed. This is extremely effective for obtaining the flat polishing properties.

The second polishing step is ended at the stage that the barrier metal layer 54 on the area which is not formed with the wiring groove 52 is exposed. The end point of the second polishing step can be detected easily by detecting presence/absence of the copper film 56 on the semiconductor wafer 22 using an optical end point detector. At this time, an over-polishing amount is set as the need arises.

When the second polishing step is ended, the arm support 14 is rotated, and the semiconductor wafer 22 supported by the polishing head 16a is carried onto the polishing platen 12c, so that the third polishing step is executed on the polishing platen 12c.

Figure 4D:
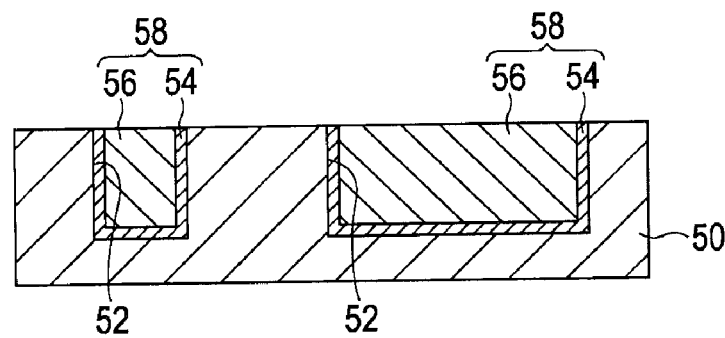

At the third polishing step, as shown in FIG. 4D, the barrier metal layer 54 is polished until the inter-layer insulating film 50 on the area which is not formed with the wiring groove 52 is exposed, and the barrier metal layer 54 on the portions other than the inside of the wiring groove 52 is eliminated. As a result, a wiring layer 58 which is embedded into the wiring groove 52 and is made of the barrier metal layer 54 and the copper film 56 is formed.

At the third polishing step, "IC400" manufactured by NITTA HAAS INCORPORATED is used as the polishing pad, and "HS-T805-H" manufactured by Hitachi Chemical Co., Ltd. is used as the slurry. The polishing is carried out under the condition that the pressure of the polishing head is 210 gf/cm$^2$, the rotating speed of the polishing head is 60 rpm, the rotating speed of the polishing platen is 70 rpm, and the supply quantity of the slurry is 0.2 lit/min. The polishing pressure described here is an average pressure to be applied to the semiconductor wafer 22, and in the case of the polishing head having a plurality of zones, the pressure should be set according to the zones.

The third polishing step is ended at the stage that the inter-layer insulating film 50 on the area which is not formed with the wiring groove 52 is exposed. The end point of the third polishing step can be detected easily by detecting presence/absence of the barrier metal layer 54 on the semiconductor wafer 22 using the optical end point detector. At this time, an over-polishing amount is set as the need arises.

When the third polishing step is ended, the semiconductor wafer 22 is removed from the polishing device 10 and is cleaned and dried. A series of the polishing steps is thus completed.

The polishing residual film profile at the first polishing step is set according to the polishing rate profile at the second polishing step, so that the in-plane distribution of the height of the wiring layer 58 after the polishing process can be greatly improved. Since it is difficult to measure the height of the wiring layer 58 in an semiconductor manufacturing apparatus, the height can be generally replaced by a dishing amount of the wiring layer 58 (see FIG. 8).

FIG. 9 is a graph illustrating the in-plane distribution of the dishing amount of the wiring layer after the polishing process. In the drawing, a solid line shows the in-plane distribution of the dishing amount of the wiring layer in the case where the polishing method according to the first embodiment is applied. A dotted line shows the in-plane distribution (comparative example) of the dishing amount of the wiring layer in the case where the condition for obtaining the flat polishing residual film profile is applied to the first polishing step.

In the polishing method according to the first embodiment, the condition of the first polishing step is determined after the polishing rate profile at the second polishing step is taken into consideration. In this method, as shown in FIG. 9, it is found that the in-plane distribution of the dishing amount of the wiring layer is more uniform than that in the case where the condition for obtaining the flat residual film polishing profile is applied to the first polishing step.

When a plurality of semiconductor wafers 22 are successively processed, even if the polishing is carried out under the same polishing condition, the polishing profile occasionally and gradually changes according to an increase in the number of processed wafers.

Therefore, after the third polishing step is ended, it is desirable that the distribution of the level difference on the surface of the semiconductor wafer 22 (for example, the dishing amount and its in-plane distribution) be measured periodically or as the need arises. The level difference distribution can be measured by a contact type level difference measuring device, AFM or the like.

When the measured level difference distribution is different from a desired polishing profile, it is fed back to the later polishing condition of the semiconductor wafer 22.

At the first polishing step, while the residual film distribution is being measured and is being feedback-controlled, the polishing is carried out. The third polishing step is a step for eliminating the thin barrier metal layer 54, and this step has a less effect on departure from the polishing profile and the dishing. For this reason, it is considered that the departure from the polishing profile caused after the end of the third polishing step is generated mainly at the second polishing step. Therefore, the influence of the measured level difference distribution is added to the polishing rate profile of the second polishing step measured in advance, so that the polishing profile selected at the first polishing step is changed.

For example, in the measurement of the level difference distribution, when the dishing amount on the peripheral portion of the semiconductor wafer 22 is larger than the dishing amount on the center portion, the polishing residual film profile in which the residual film on the peripheral portion becomes thicker is selected as the polishing residual film profile at the first polishing step, and the subsequent polishing of the semiconductor wafer 22 is continued.

As a result, also when the plurality of semiconductor wafers 22 are sequentially processed, the polishing process can be continued with the stable polishing profile.

According to the first embodiment, when the embedded wiring layer is formed at the plurality of polishing steps, the polishing profile at the second polishing step where the residual film thickness distribution is difficult to be monitored is measured in advance. At the first polishing step where the residual film thickness distribution can be monitored, the polishing profile obtained by taking the polishing profile at the second polishing profile into consideration is selected, and the polishing is carried out. For this reason, the in-plane distribution of the height of the wiring layer can be greatly improved. As a result, in-plane dispersion of the resistance of the wiring layer to be formed can be reduced, so that yield of the semiconductor device can be improved.

[Second Embodiment]

The polishing device and the polishing method according to a second embodiment will be described with reference to FIGS. 10 to 16. The same components as those of the polishing apparatus and polishing method according to the first embodiment shown in FIGS. 1 to 9 are denoted by the same reference symbols, and the description thereof is omitted or simplified.

Figure 10:
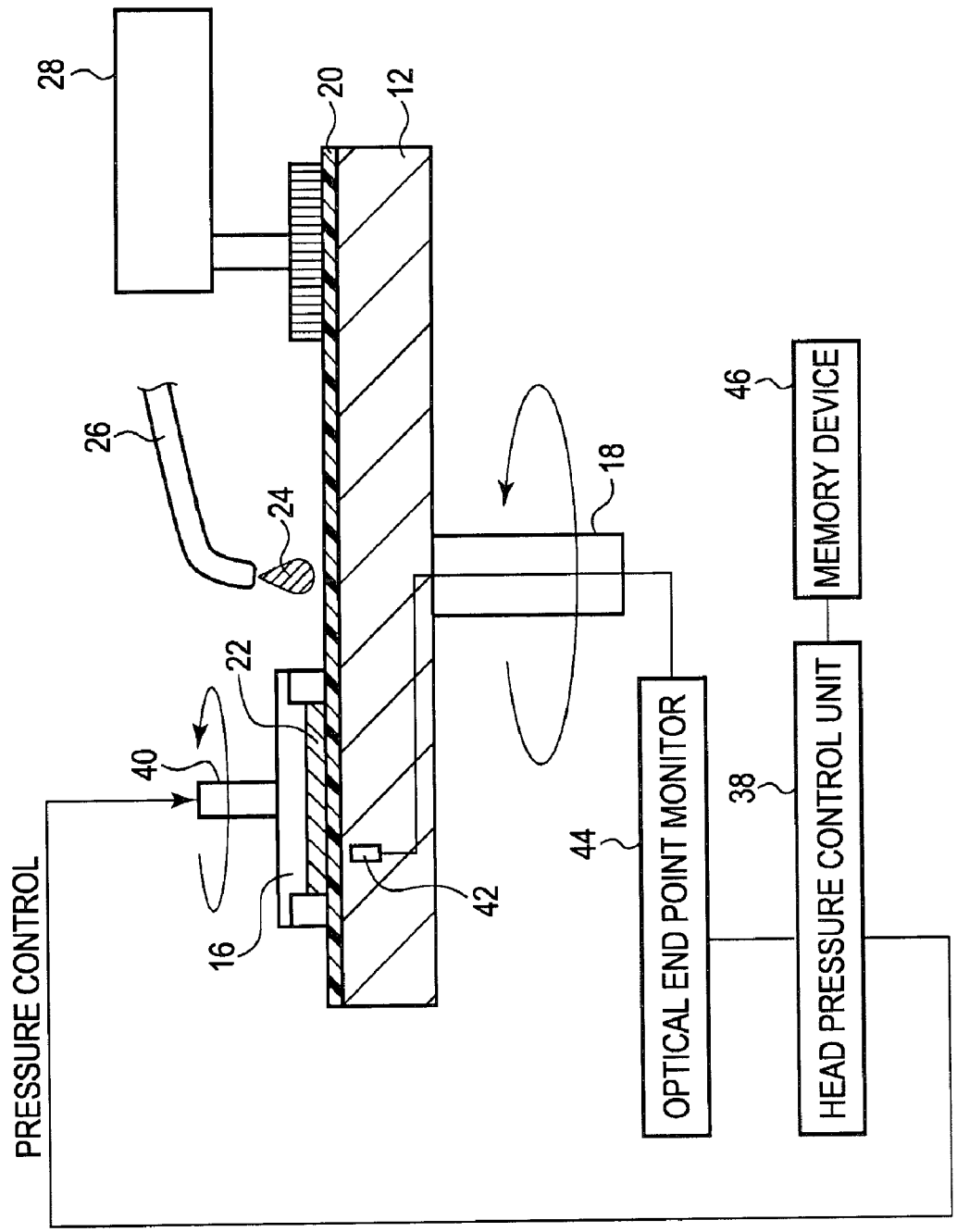
FIG. 10 is a schematic sectional view illustrating a constitution of a polishing device according to a second embodiment of the present invention.
Figure 13:
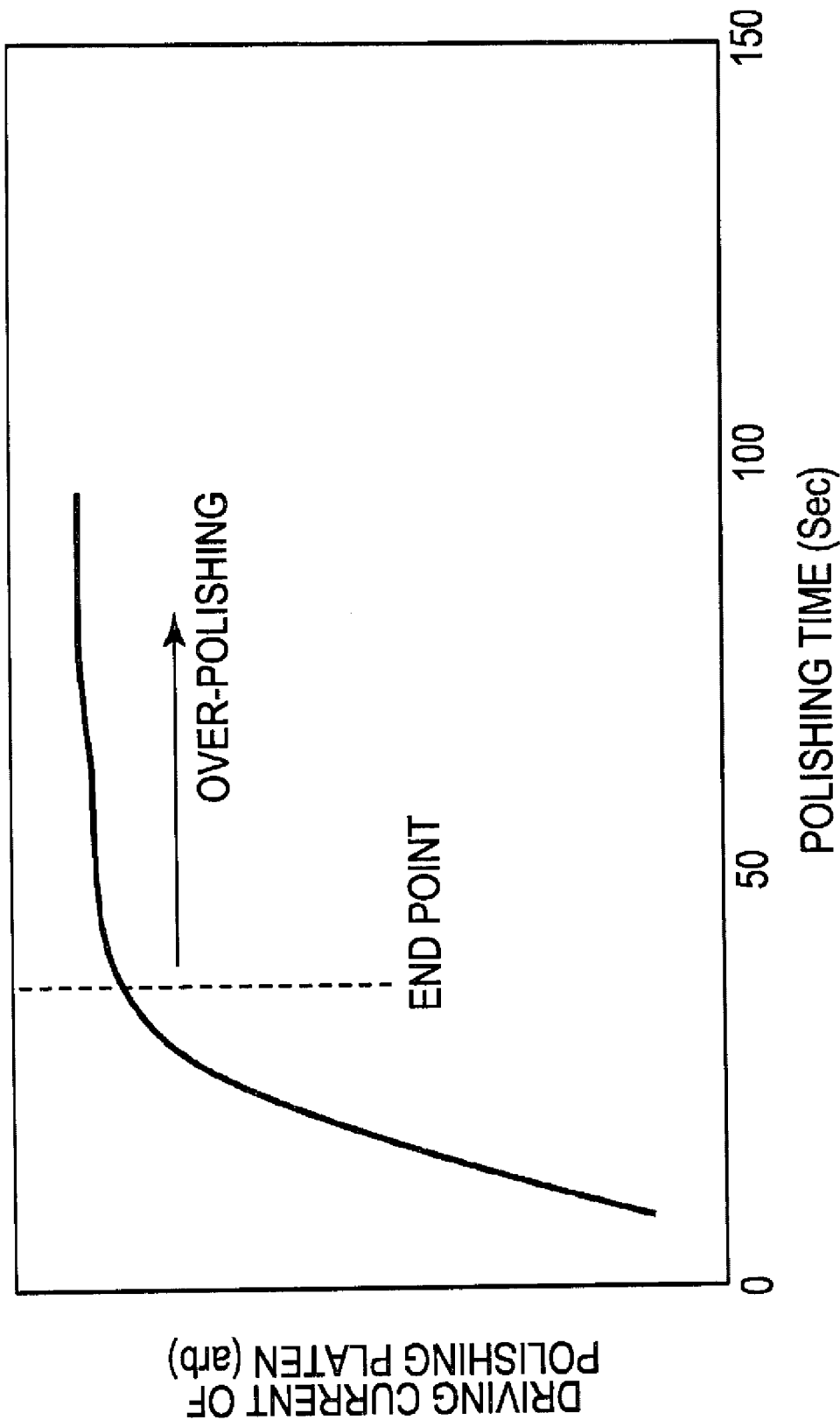
FIG. 13 is a graph illustrating a relationship between a driving current and polishing time of a polishing platen at the second polishing step of the polishing method according to the second embodiment of the present invention.
Figure 14:
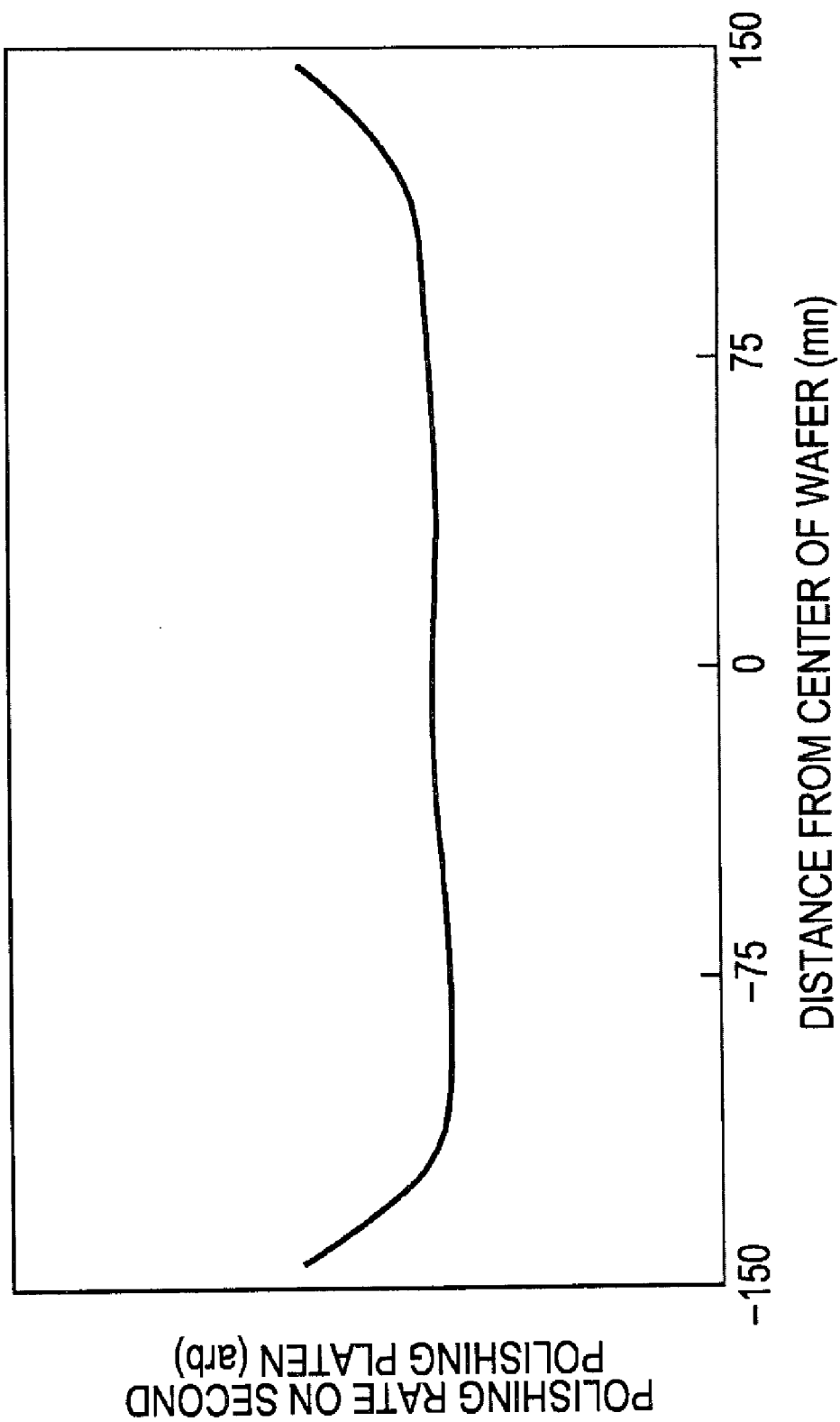
FIG. 14 is a graph illustrating an example of a polishing rate profile at the second polishing step of the polishing method according to the second embodiment of the present invention.
Figure 15:
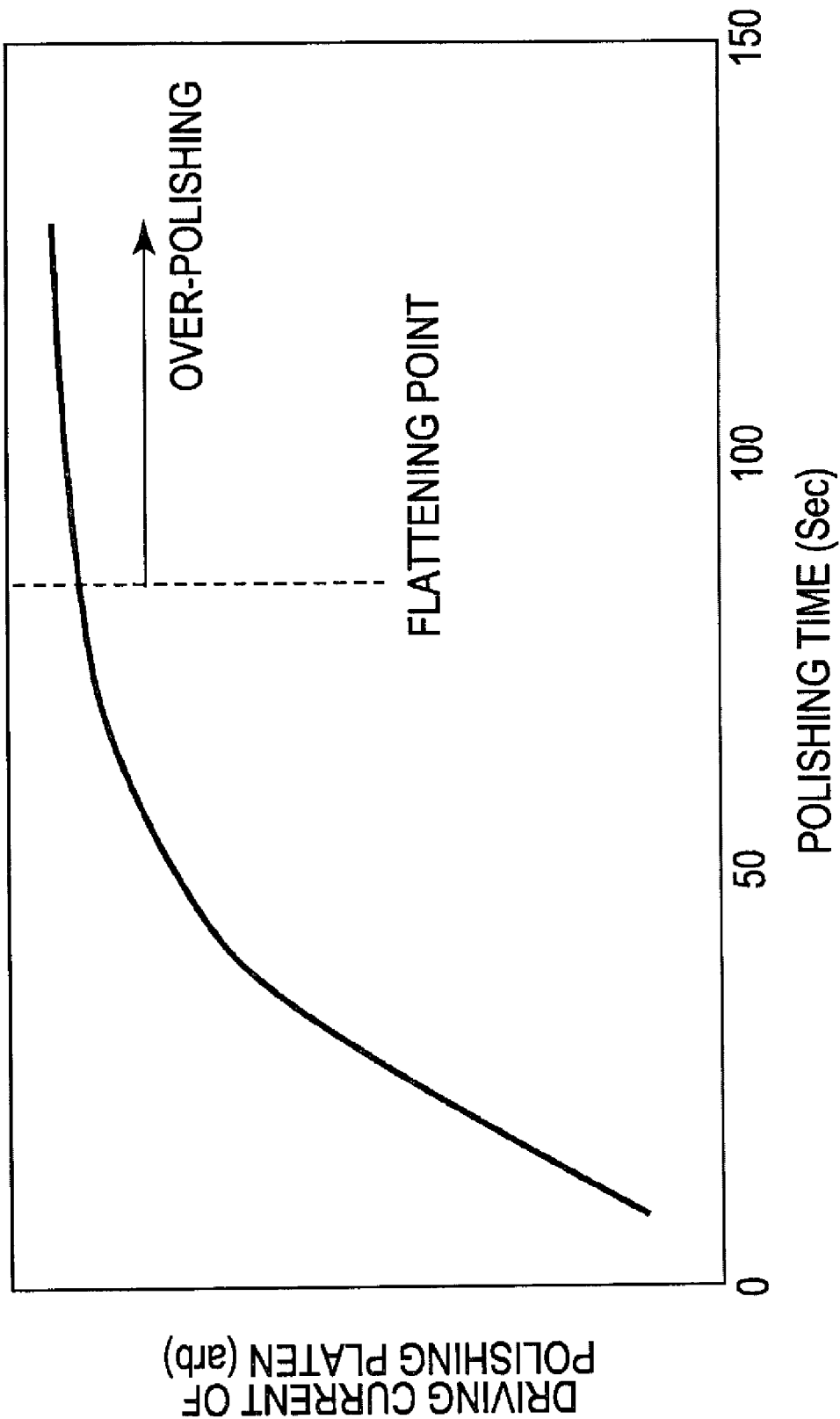
FIG. 15 is a graph illustrating a relationship between the driving current and the polishing time of the polishing platen at a third polishing step of the polishing method according to the second embodiment of the present invention.
Figure 16:
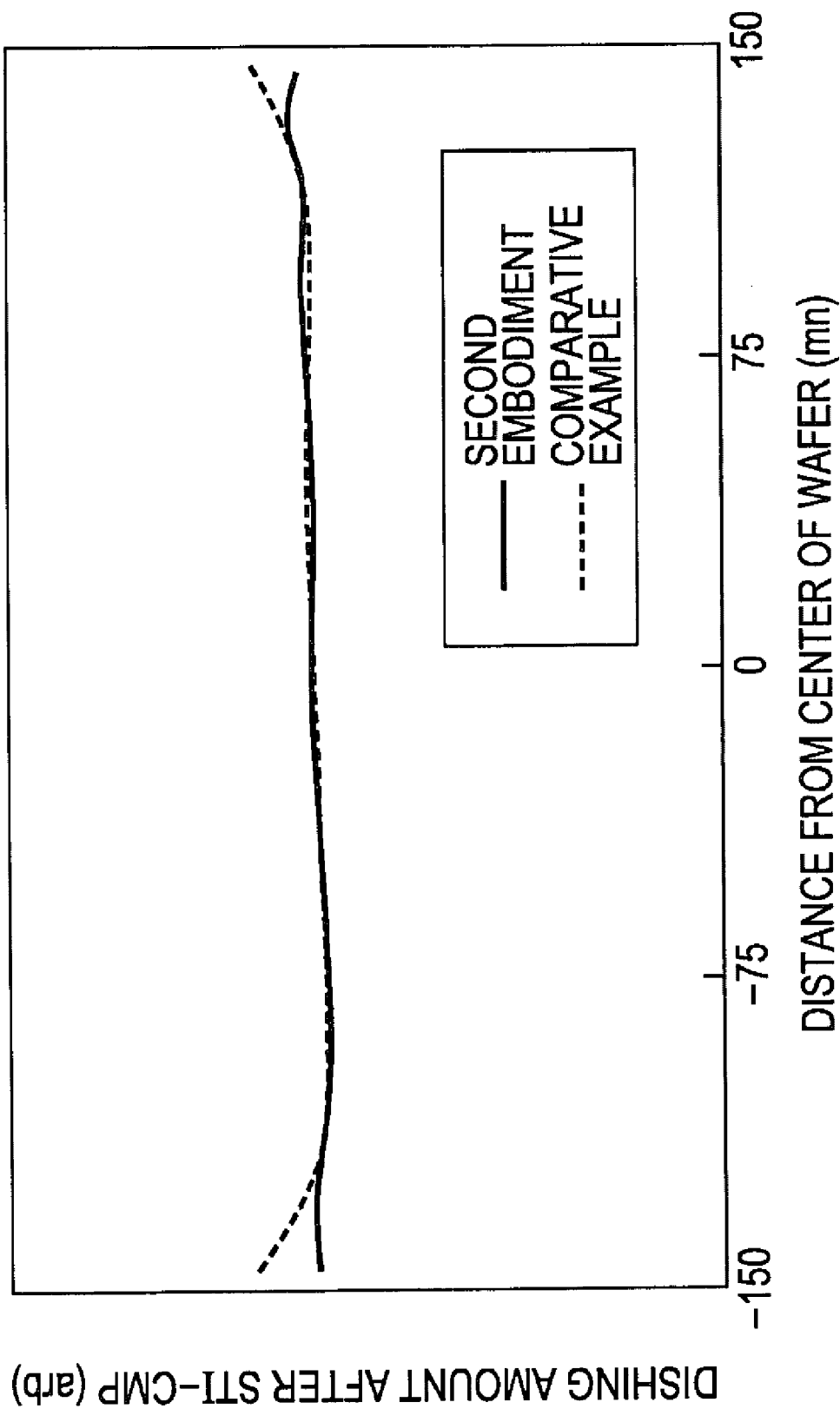
FIG. 16 is a graph illustrating the wafer in-plane distribution of the dishing amount of the wiring layer formed by the polishing method according to the second embodiment of the present invention.

FIG. 10 is a schematic plan view illustrating an entire constitution of the polishing device according to the second embodiment, and FIGS. 11 and 12 are step sectional views illustrating the polishing method according to the second embodiment. FIG. 13 is a graph illustrating a relationship between the driving current and the polishing time of the polishing platen at the second polishing step, and FIG. 14 is a graph illustrating an example of the polishing rate profile at the second polishing step. FIG. 15 is a graph illustrating the relationship between the driving current and the polishing time of the polishing platen at the third polishing step, and FIG. 16 is a graph illustrating a wafer in-plane distribution of the dishing amount of an element separation film.

The constitution of the polishing device according to the second embodiment will be described firstly with reference to FIG. 10.

The basic constitution of the polishing device according to the second embodiment is similar to that of the polishing device according to the first embodiment shown in FIGS. 1 to 3. A main feature of the polishing device according to the second embodiment is that an optical end point detector is provided instead of the eddy current detector.

That is, as shown in FIG. 10, an optical end point detector 42 which observes a surface state of the semiconductor wafer 22 during polishing is embedded into the polishing platen 12 under the polishing head 16. The optical end point detector 42 is connected to an optical end point monitor 44, and the end point of the polishing can be detected based on a signal detected by the optical end point detector 42. The optical end point monitor 44 is connected to the head pressure control unit 38, and the polishing pressure of the semiconductor wafer 22 can be controlled based on the signal detected by the optical end point detector 42.

The optical end point detector 42 irradiates the semiconductor wafer 22 with, for example, a red laser or white light so as to monitor a wavelength of its reflected light. This detector 42 can monitor the residual film thickness of the insulating film and its distribution. The light for measurement passes through a hole formed on the polishing pad 20 so as to be emitted to the semiconductor wafer 22.

The polishing method according to the second embodiment will be described below with reference to FIGS. 5 and 11 to 16. In the second embodiment, the polishing method for the insulating film, particularly the polishing method at the time of forming the element separation film using the STI method will be described.

The semiconductor wafer 22 to be polished is prepared. The wafer 22 to be polished is formed by, for example, a method for manufacturing a semiconductor device shown in FIGS. 11A to 11D.

A silicon oxide film 62 with film thickness of about 10 nm, for example, is formed on a silicon substrate 60 by a thermal oxidizing method.

Figure 11A:
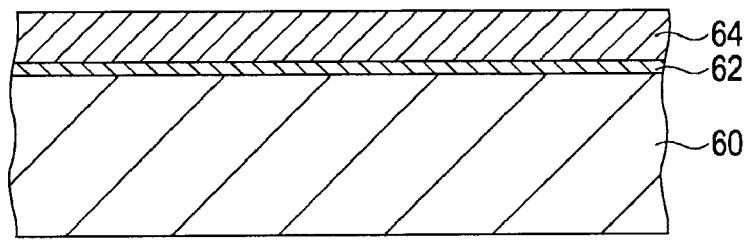
FIGS. 11A to 11D are step diagrams (1) illustrating a polishing method according to the second embodiment of the present invention.

A silicon nitride film 64 with film thickness of about 90 nm is formed on the silicon oxide film 62 by a CVD method, for example (FIG. 11A).

Figure 11B:
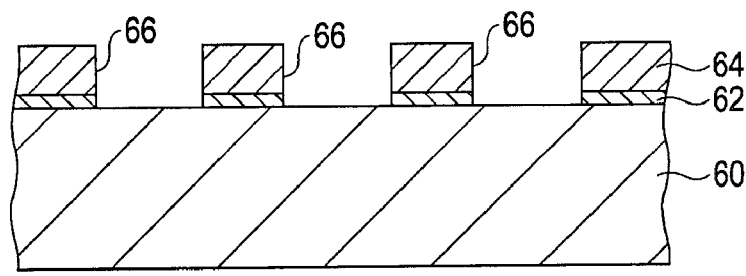

The silicon nitride film 64 and the silicon oxide film 62 are patterned by photolithography and dry etching, and an opening 66 is formed on the silicon nitride films 64 and the silicon oxide films 62 in areas where the element separation film is supposed to be formed (FIG. 11B).

Figure 11C:
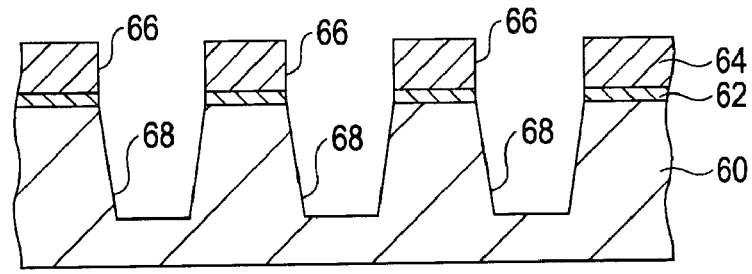

The silicon substrate 10 is an isotropically etched by using the silicon nitride films 64 formed with the openings 66 as masks, and element separation grooves 68 with depth of about 300 nm from the surface of the silicon nitride films 64 are formed on the silicon substrate 10 in the areas where the openings 66 are formed (FIG. 11C).

After a liner film (not shown) made of a silicon oxide film, for example, is formed on inner walls of the element separation grooves 68 by the thermal oxidizing method, a silicon oxide film 70 with film thickness of 450 nm is deposited by a high-density plasma CVD method. As a result, the element separation grooves 68 are filled with the silicon oxide film 70. Level differences which reflect the element separation grooves 68 are formed on the surface of the silicon oxide film 70.

Figure 11D:
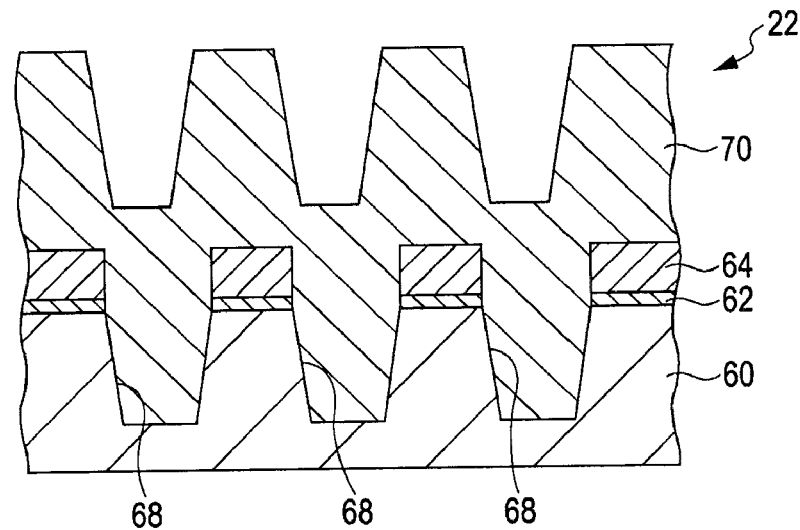

In such a manner, the semiconductor wafer 22 to be polished is obtained (FIG. 11D).

The formed semiconductor wafer 22 is polished by using the polishing device shown in FIG. 1. At the CMP step at the time of forming the element separation films using the STI method, the silicon oxide film 70 is roughly cut at the first polishing step, the silicon oxide film 70 is flattened at the second polishing step and is final-polished at the third polishing step.

When the polishing is carried out in three steps, the polishing platens 12a, 12b and 12c of the polishing device shown in FIG. 1 are applied to the respective steps, so that the plurality of semiconductor wafers 22 can be successively processed. The first polishing step for roughly cutting the silicon oxide film 70 is executed on the polishing platen 12a, and the second polishing step for flattening the silicon oxide film 70 is executed on the polishing platen 12b. The third polishing step for finishing is executed on the polishing platen 12c.

The semiconductor wafer 22 to be polished is carried into the polishing device 10. In the polishing device 10 of FIG. 1, the semiconductor wafer 22 to be polished is carried onto the polishing platen 12a used at the first polishing step by the polishing head 16a.

Figure 12A:
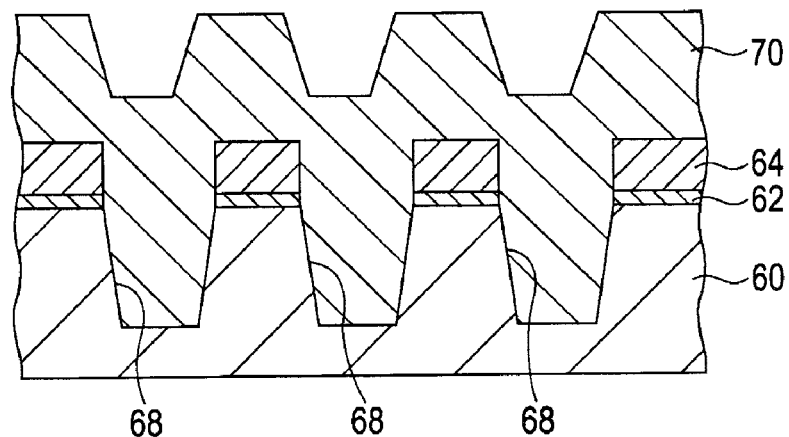
FIGS. 12A to 12C are step diagrams (2) illustrating the polishing method according to the second embodiment of the present invention.

At the first polishing step, as shown in FIG. 12A, the silicon oxide film 70 is polished until the film thickness of the silicon oxide film 70 on the silicon nitride film 64 becomes about 150 nm. The residual film thickness of the silicon oxide film 70 at the first polishing step does not always have to be 150 nm.

The first polishing step is executed by using "IC1510" manufactured by NITTA HAAS INCORPORATED as the polishing pad and "SEMI SPRES 25" manufactured by Cabot as the slurry under the condition that the pressure of the polishing head is 210 gf/cm$^2$, the rotating speed of the polishing head is 98 rpm, the rotating speed of the polishing platens is 100 rpm, and the supply quantity of the slurry is 0.2 lit/min. The polishing rate of the silicon oxide film formed by high-density plasma CVD method under this polishing condition is about 300 nm/min.

A concrete flow chart of the first polishing step will be described with reference to FIG. 5.

Prior to the polishing process, a database, which shows a relationship between the polishing condition and the polishing profile obtained by the polishing using the condition in the case of using the polishing platen 12a, is input into the memory device 46 (step S11). Examples of the polishing residual film profile include the profile where the wafer edge becomes thick as shown in FIG. 6A, the profile which is flat as shown in FIG. 6B, and the profile where the wafer edge becomes thin as shown in FIG. 6C similarly to the case of the first embodiment. The polishing residual film profile can be arbitrarily set as the need arises besides the profiles shown in FIGS. 6A to 6C.

When the operation for inputting the database at step S11 is once performed, this operation is not always necessary because data are accumulated in the memory device 46. When new data about the relationship between the polishing condition and the polishing residual film profile is necessary, that data may be input suitably. Numerical values may be input, or the data may be input by handwriting using a pen-type input device. A control width (a film thickness range of the polishing residual film) of the profile may be input as values.

A desired polishing residual film profile to be obtained at the first polishing step is selected from the database input at step S11 (step S12). The polishing residual film profile may be selected automatically from the database in the memory device 46 by a computer, or may be selected by an operator. The reason why the polishing residual film profile is selected at the first polishing step will be described later.

The polishing of the semiconductor wafer 22 is started by using the polishing conditions related with the selected polishing residual film profile (step S13). When a suitable polishing residual film profile is not present in the database, a new polishing condition may be calculated by parity of reasoning based on an existing database. For example, when the suitable polishing residual film profile is positioned between the two polishing residual film profiles on the database, a condition between the polishing conditions for obtaining the two polishing residual film profiles on the database can be calculated. Alternatively, a new polishing condition may be input. During the polishing of the semiconductor wafer 22, the residual film thickness of the silicon oxide film 70 and its distribution are monitored by the optical end point detector 42 and the optical end point monitor 44 (step S14).

When the monitored residual film thickness of the silicon oxide film 70 is not a target film thickness, the polishing process is continued. When the monitored profile is not a target one, the head pressure is controlled so that a target profile can be obtained (step S16), and the polishing process is continued. The head pressure is controlled by controlling pressures of the pressure chambers 36a to 36e in the polishing head 16.

For example, as to the selected polishing residual film profile, when the residual film thickness on the peripheral portion of the semiconductor wafer 22 is comparatively thicker than a residual film thickness of the center portion, the pressures of the pressure chambers 36a to 36e are controlled so that the set values of the pressures of the pressure chambers corresponding to the zones on the peripheral portion of the semiconductor wafer 22 are comparatively increased. As to the selected polishing residual film profile, when the residual film thickness on the peripheral portion of the semiconductor wafer 22 is comparatively thinner than the residual film thickness of the center portion, the pressures of the pressure chambers 36a to 36e are controlled so that the set values of the pressures of the pressure chambers corresponding to the zones on the peripheral portion of the semiconductor wafer 22 are comparatively reduced.

When the monitored residual film thickness of the silicon oxide film 70 reaches a target film thickness (for example, 150 nm), the first polishing step on the polishing platen 12a is ended (step S17).

When the first polishing step is ended, the arm support 14 is rotated, and the semiconductor wafer 22 supported by the polishing head 16*a* is carried onto the polishing platen 12*b*. The second polishing step is executed on the polishing platen 12*b*.

Figure 12B:
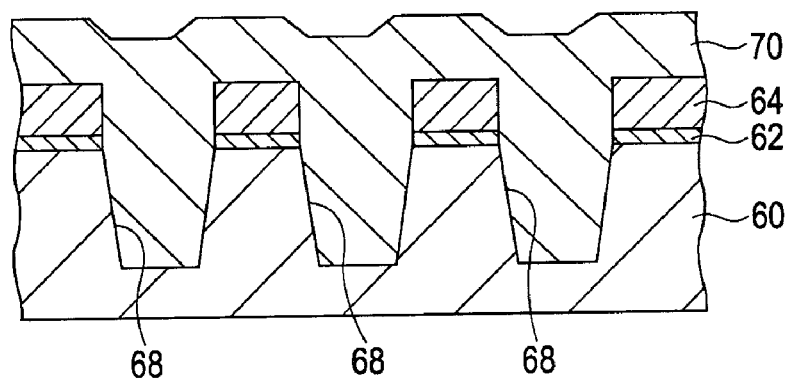

At the second polishing step, as shown in FIG. 12B, the silicon oxide film 70 is polished until unevenness on the surface of the silicon oxide film 70 is almost eliminated.

The second polishing step is executed by using "IC1510" manufactured by NITTA HAAS INCORPORATED as the polishing pad and "STI2100 RA11" manufactured by DA Nanomaterial as the slurry under the condition that the pressure of the polishing head is 280 gf/cm$^2$, the rotating speed of the polishing head is 118 rpm, the rotating speed of the polishing platens is 120 rpm, and the supply quantity of the slurry is 0.2 lit/min. When the above slurry is used, a portion to which the pressure is applied can be polished intensively, and the convex portion on which the polishing pressure is concentrated is polished. When the silicon oxide film 70 becomes flat to a certain extent, the polishing hardly progresses. The polishing rate of the silicon oxide film formed by the high-density plasma CVD method under the polishing condition is about 20 nm/min.

The end point of the second polishing step can be detected by monitoring a rotating torque of the polishing platen 12 (a voltage or an electric current is used in place of the torque).

FIG. 13 is a graph illustrating the relationship between the driving current and the polishing time of the polishing platen at the second polishing step. As shown in FIG. 13, the driving current of the polishing platen gradually increases in the initial stage of the polishing, but it becomes approximately constant when a certain polishing time or more passes. This is because a contact area of the silicon oxide film 70 with respect to the polishing pad 20 gradually increases as the polishing progresses, and when it is roughly flattened, the contact area does not further increase and thus the torque becomes constant. Therefore, when the measurement shown in FIG. 13 is taken, the time point at which the driving current of the polishing platen becomes approximately constant can be determined as the end point of the polishing at the second polishing step. At this time, the over-polishing amount can be set as the need arises.

The film thickness of the silicon oxide film 70 on the silicon nitride film 64 becomes about 100 nm at the time point at which the second polishing step is ended.

In the case of the polishing carried out at the second polishing step, namely, the process with which the polishing hardly progresses after the surface of the silicon oxide film 70 is flattened, as shown in FIG. 14, for example, the polishing rate profile easily becomes edge fast. For this reason, when the polishing condition for obtaining the flat polishing residual film profile is applied to the first polishing step, in-plane uniformity of the polishing after the end of the second polishing step cannot be realized.

When the polishing rate profile at the second polishing step is obtained in advance, the polishing profile which negates the polishing rate profile at the second polishing step is selected as the polishing profile at the first polishing step. As a result, the residual film distribution at the time of end of the second polishing step can be set uniformly in the plane. For example, when the second polishing step tends to be edge fast as shown in FIG. 14, the polishing profile shown in FIG. 6A, where the wafer edge becomes slightly thicker than that in the flat polishing profile shown in FIG. 6B, is applied to the first polishing step. As a result, after the end of the second polishing step, flatter polishing property can be obtained.

The database, which shows the relationship between the polishing condition and the polishing profile obtained by the polishing using the condition at the first polishing step, is accumulated in the memory device 46, and a suitable polishing residual film profile is selected from the database so that the first polishing step is executed. This is very effective for obtaining the flat polishing property.

After the end of the second polishing step, the arm support 14 is rotated, and the semiconductor wafer 22 supported by the polishing head 16*a* is carried onto the polishing platen 12*c*, so that the third polishing step is executed on the polishing platen 12*c*.

Figure 12C:
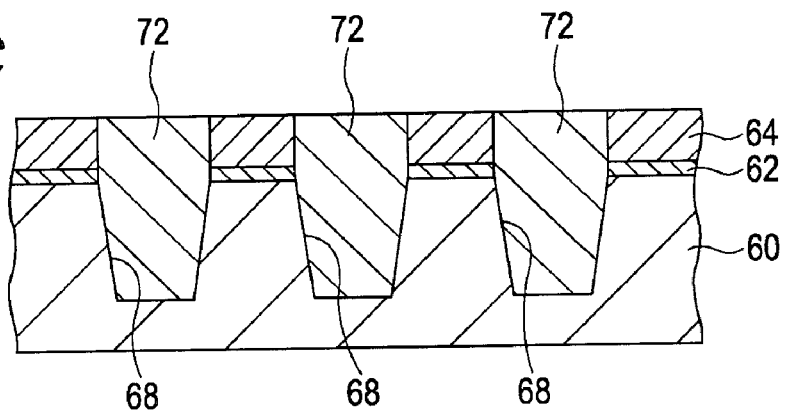

At the third polishing step, as shown in FIG. 12C, the polishing is carried out until the silicon oxide film 70 on the silicon nitride film 64 is eliminated. As a result, an element separation film 72 composed of the silicon oxide film 70 embedded into the element separation grooves 68 is formed.

At the third polishing step, "IC1510" manufactured by NITTA HAAS INCORPORATED is used as the polishing pad, and a substance which is obtained by blending "STI2100 RA11" manufactured by DA Nanomaterial and ultra-pure water at a ratio of 1:3 is used as slurry. The polishing is carried out under the condition that the pressure of the polishing head is 210 gf/cm$^2$, the rotating speed of the polishing head is 118 rpm, the rotating speed of the polishing platens is 120 rpm, and the supply quantity of the slurry is 0.2 lit/min. When the slurry with which the polishing hardly progresses at the time when the flattening is completed is diluted with pure water, additive which inhibits the polishing is also diluted so that the effect is weakened. For this reason, when the above slurry is used, the silicon oxide film 70 can be polished to a certain extent. The polishing rate of the silicon oxide film formed by the high-density plasma CVD method under this polishing condition is about 100 nm/mim.

The end point of the third polishing step can be detected by monitoring the rotating torque of the polishing platen 12 (a voltage or an electric current is used as a substitute for the torque) similarly to the second polishing step.

FIG. 15 is a graph illustrating a relationship between the driving current and the polishing time of the polishing platen at the third polishing step. As shown in FIG. 15, the driving current of the polishing platen gradually increases in the initial stage of the polishing, but it becomes approximately constant at a certain polishing time and after. Therefore, when the measurement shown in FIG. 15 is taken, the time point at which the driving current of the polishing platen becomes approximately constant can be determined as the end point of the polishing at the third polishing step. At this time, the over-polishing amount can be set as the need arises.

When the third polishing step is ended, the semiconductor wafer 22 is taken out of the polishing device 10 and is cleaned and dried, so that a series of the polishing steps is ended.

When the polishing residual film profile at the first polishing step is set according to the polishing rate profile at the second polishing step, the in-plane distribution of the height of the element separation film 72 after the polishing process can be greatly improved. Since the height of the element separation film 72 is difficult to be measured in the semiconductor manufacturing device, the height can be generally replaced by the dishing amount of the element separation film 72.

FIG. 16 is a graph illustrating the in-plane distribution of the dishing amount of the element separation film after the polishing process. In the drawing, a solid line shows the in-plane distribution of the dishing amount of the element separation film in the case where the polishing method according to the second embodiment is applied, and a dotted line shows the in-plane distribution (comparative example) of the dishing amount of the element separation film in the case where the condition for obtaining the flat polishing residual film profile is applied to the first polishing step.

As shown in FIG. 16, it is found that the in-plane distribution of the dishing amount of the element separation film is more uniform in the polishing method according to the second embodiment in which the condition of the first polishing step is determined considering the polishing rate profile of the second polishing step than the case where the condition for obtaining the flat residual film polishing profile is applied to the first polishing step.

When the plurality of semiconductor wafers 22 are processed successively, even if the polishing is carried out under the same polishing condition, the polishing profile occasionally and gradually changes according to the increase in the number of semiconductor wafers to be processed.

Therefore, after the third polishing step is ended, it is desirable that the distribution of the level difference on the surface of the semiconductor wafer 22 (for example, the dishing amount and its in-plane distribution) be measured periodically or as the need arises. The distribution of the level difference can be measured by a contact type level difference measuring device or AFM.

When the measured level difference distribution is different from a desired polishing profile, the distribution is fed back to the conditions of later polishing of the semiconductor wafer 22.

In the measurement of the distribution of the level difference, when the dishing amount on the peripheral portion of the semiconductor wafer 22 is larger than the dishing amount on the center portion, the polishing residual film profile where the residual film on the peripheral portion becomes thicker is selected as the polishing residual film profile at the first polishing step, and the later polishing of the semiconductor wafer 22 is continued.

As a result, also when the plurality of semiconductor wafers 22 are processed successively, the polishing process can be continued with the stable polishing profile.

According to the second embodiment, when the element separation film is formed by the STI method at the plurality of polishing steps, the polishing profile at the second polishing step where the flat polishing property is difficult to be obtained is measured in advance. The polishing profile where the polishing profile at the second polishing step is taken into consideration is selected so that the polishing is carried out at the first polishing step. For this reason, the in-plane distribution of the height of the element separation film can be greatly improved. As a result, the in-plane dispersion of the thickness of the formed element separation film can be reduced, and the yield of the semiconductor device can be improved.

[Modified Embodiment]

In the first embodiment, the wiring layer is made of mainly copper, but the wiring layer may be made of another metal material such as tungsten or aluminum.

In the second embodiment the element separation film is formed by the STI method, but it is not limited to this.

The second embodiment has described the method in the case where the element separation film is formed by the STI method, but the method may be applied also to another step of polishing an insulating film such as the flattening step for the inter-layer insulating film.

What is claimed is:

1. A method of manufacturing a semiconductor device, comprising:
    a first step of forming an element isolation groove on a semiconductor substrate using a mask formed on the semiconductor substrate;
    a second step of forming an insulating film on the semiconductor substrate formed with the element isolation groove;
    a third step of halfway removing the insulating film on an area which is not formed with the element isolation groove by means of polishing;
    a fourth step of removing the insulating film by means of polishing until the surface of the insulating film is flattened; and
    a fifth step of removing the insulating film by means of polishing until the mask is exposed, wherein
    a first film thickness profile showing an in-plane distribution of a film thickness of the insulating film after the fourth step is measured in advance, and
    in the third step, the polishing is carried out by using a polishing condition for obtaining a second film thickness profile having a size relation in a film thickness opposite to the first film thickness profile.

2. The method for manufacturing a semiconductor device according to claim 1, wherein in the third, fourth and fifth steps, different polishing platens are used respectively.

* * * * *